United States Patent [19]
Martin et al.

[11] Patent Number: 5,956,002
[45] Date of Patent: Sep. 21, 1999

[54] STRUCTURES AND METHODS FOR LIMITING CURRENT IN IONIZABLE GASEOUS MEDIUM DEVICES

[75] Inventors: Paul C. Martin, Vancouver, Wash.; Thomas S. Buzak; Kevin J. Ilcisin, both of Beaverton, Oreg.

[73] Assignee: Tektronix, Inc., Wilsonville, Oreg.

[21] Appl. No.: 08/803,738

[22] Filed: Feb. 21, 1997

Related U.S. Application Data

[60] Provisional application No. 60/014,296, Mar. 29, 1996.
[51] Int. Cl.$^6$ .................................................. G09G 3/28
[52] U.S. Cl. ................................. 345/60; 345/66
[58] Field of Search ................... 345/60, 62, 66, 345/67

[56] References Cited

U.S. PATENT DOCUMENTS

| | | | |
|---|---|---|---|
| 4,896,149 | 1/1990 | Buzak et al. | 340/794 |
| 5,349,455 | 9/1994 | Hayashi et al. | 359/54 |
| 5,453,660 | 9/1995 | Martin et al. | 313/582 |
| 5,519,520 | 5/1996 | Stoller | 345/66 |

*Primary Examiner*—Matthew Luu
*Attorney, Agent, or Firm*—John D. Winkelman; John Smith-Hill

[57] ABSTRACT

This invention is a resistive layer (112, 122) for electrodes (30, 62) comprising at least one partially conductive compound and describes processes for coating the electrodes by way of cataphoretic deposition and/or screen printing of particles of at least one partially conductive compound. A second class of particles, known as a "frit," is also deposited or screen printed. In the subsequent one hour firing, these particles melt and thereby bond the partially conductive compound particles to the electrodes. This invention is also plasma addressing structures (110, 120) in which particles of at least one partially conductive compound are deposited on the electrodes of the display by cataphoretic deposition and/or screen printing. The resulting electrode structures limit and uniformly distribute discharge currents (102) in the operation of ionizable gaseous medium (90) devices, such as plasma addressed liquid crystal displays.

35 Claims, 5 Drawing Sheets

STRUCTURES AND METHODS FOR LIMITING CURRENT IN IONIZABLE GASEOUS MEDIUM DEVICES

CROSS REFERENCE TO RELATED APPLICATIONS

This application claims the benefit of U.S. Provisional Application No. 60/014,296, filed Mar. 29, 1996 pending.

TECHNICAL FIELD

This invention relates to electronic image display devices and, more particularly, to the formation of electrode structures having a uniformly distributed and limited discharge current in a plasma display addressing structure.

BACKGROUND OF THE INVENTION

Systems employing data storage elements include, for example, video cameras and image displays. Such systems employ an addressing structure that provides data to or retrieves data from the storage elements. One system of this type to which one embodiment of this invention is particularly directed is a general purpose flat panel display having storage or display elements that store light pattern data. Flat panel-based display systems present a desirable alternative to the comparatively heavy, bully, and high-voltage cathode-ray tube-based systems.

A flat panel display comprises multiple display elements or "pixels" distributed throughout the viewing area of a display surface. In a liquid crystal flat panel display the optical behavior of each pixel is determined by the magnitude of the electrical potential gradient applied across it. It is generally desirable in such a device to be able to set the potential gradient across each pixel independently. Various schemes have been devised for achieving this end. In currently available active matrix liquid crystal arrays there is, generally, a thin film transistor for every pixel. This transistor is typically strobed "on" by a row driver line at which point it will receive a value from a column driver line. This value is stored until the next row driver line strobe. Transparent electrodes on either side of the pixel apply a potential gradient corresponding to the stored value across the pixel, determining its optical behavior.

U.S. Pat. No. 4,896,149 describes the construction and operation of an alternative type of active matrix liquid crystal array, named a "plasma addressable liquid crystal" or "PALC" display. This technology avoids the cumbersome and restrictive use of a thin film transistor for every pixel. Each pixel of the liquid crystal cell is positioned between a thin, impermeable dielectric barrier and a conductive surface. On the opposed side of the thin barrier an inert gas is stored that may be selectively switched from a nonionized, nonconductive state to an ionized conductive plasma through the application of a sufficient electrical potential gradient across the gas volume.

When the gas is in a conductive state, it effectively sets the surface of the thin barrier to ground potential. In this state, the electrical potential across the pixel and thin dielectric barrier is equal to whatever voltage appears on the conductive surface. After the voltage across the gas volume is removed, the ionizable gas reverts to a nonconductive state. The potential gradient introduced across the pixel is stored by the natural capacitances of the liquid crystal material and the dielectric barrier. This potential gradient remains constant regardless of the voltage level of the conductive surface because the thin barrier voltage will float at a level below that of the conductive surface by the difference that was introduced while it was grounded.

Viewed on a larger scale, a PALC display includes a set of channels formed in an insulating plate and containing inert gas under a top plate that contacts the tops of the ribs forming the channel and is sealed around the periphery with the insulating plate. Parallel electrodes extend along the length of each channel at opposed sides. During operation, the gas is ionized and thereby rendered a conductive plasma by the introduction of a large potential gradient between opposed electrodes. This operation occurs many times per second while the display is in operation.

To avoid differences in electrical potential along the length of the electrodes during the ionization of the gas, it is desirable that the resistance per unit length of the electrodes be no more than 2 ohms per centimeter (5 ohms per inch). To achieve this small value of resistance per unit length with the tiny cross sectional area that is available for the electrodes, highly conductive metals such as gold, silver, copper, and aluminum are used. To reduce fabrication costs and prevent life-reducing sputtering problems, copper electrodes are typically employed that are plated with oxidation and sputter-resistant coatings.

However, it has been found that reducing the resistance per unit length of the electrodes often results in excessive and nonuniform plasma discharge current along the length of the electrode. The excessive discharge current leads to life-reducing problems, such as sputtering, and the nonuniform discharge current leads to nonuniform display addressing, or even display addressing dropouts, as described in the following example.

Consider a spark coil driving a pair of spark plugs that are connected in parallel by a pair of low-resistance wires. Minute differences in the spark plug gaps will cause one of the spark plugs to fire first, which limits the voltage available to the other spark plug, thereby preventing it from firing. In like manner for a PALC display, consider a voltage driving a pair of adjacent discharge points that are connected in parallel by the low resistance electrode. Minute differences in the gas mixture or gap spacing between the electrodes will cause one of the discharge points to fire first, which limits the voltage available to the adjacent discharge point, thereby preventing it from discharging or otherwise reducing the amount of discharge current available. Display addressing dropout regions have been experienced between adjacent discharge points that are separated by as much as 3 centimeters.

What are needed, therefore, are electrode structures that are inexpensive to fabricate, have low resistances per unit of length and provide a uniform discharge current along their entire lengths to prevent display addressing dropouts.

SUMMARY OF THE INVENTION

An object of this invention is, therefore, to provide an electrode structure that provides a uniform discharge current along its entire length.

Another object of this invention is to provide such an electrode structure in a PALC display.

A further object of this invention is to provide a method of making such an electrode structure.

This invention is a resistive coating for electrodes comprising at least one partially conductive compound and describes processes for coating the electrodes by way of cataphoretic deposition and/or screen printing of particles of at least one partially conductive compound. A second class of particles, known as a "frit," is also deposited or screen printed. In the subsequent one hour firing, these particles melt and thereby bond the partially conductive compound particles to the electrodes.

This invention is also plasma addressing structures in which particles of at least one partially conductive compound are deposited on the electrodes of the display by cataphoretic deposition and/or screen printing. The resulting electrode structures limit and uniformly distribute the discharge currents in the operation of ionizable gaseous medium devices, such as PALC displays.

Additional objects and advantages of this invention will be apparent from the following detailed description of preferred embodiments thereof, which proceeds with reference to the accompanying drawings.

DETAILED DESCRIPTION OF PREFERRED EMBODIMENTS

Figure 1:
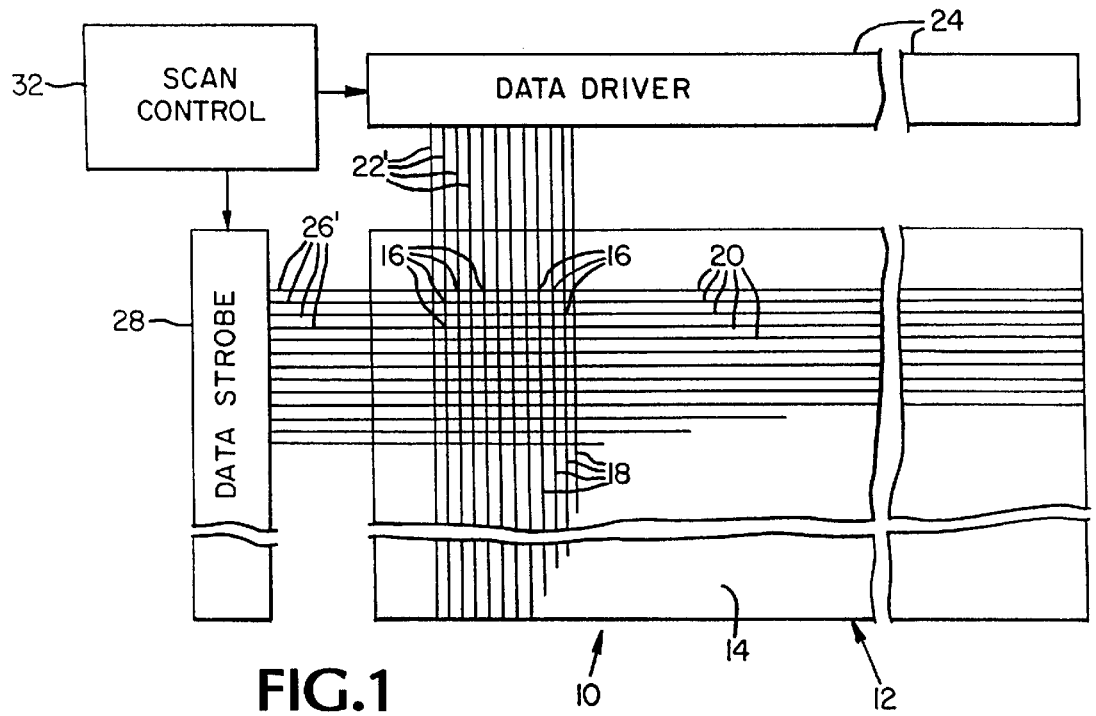
FIG. 1 is a diagram showing a frontal view of the display surface of a prior art display panel and associated drive circuitry of a plasma addressing structure in which this invention could be employed.
Figure 2:
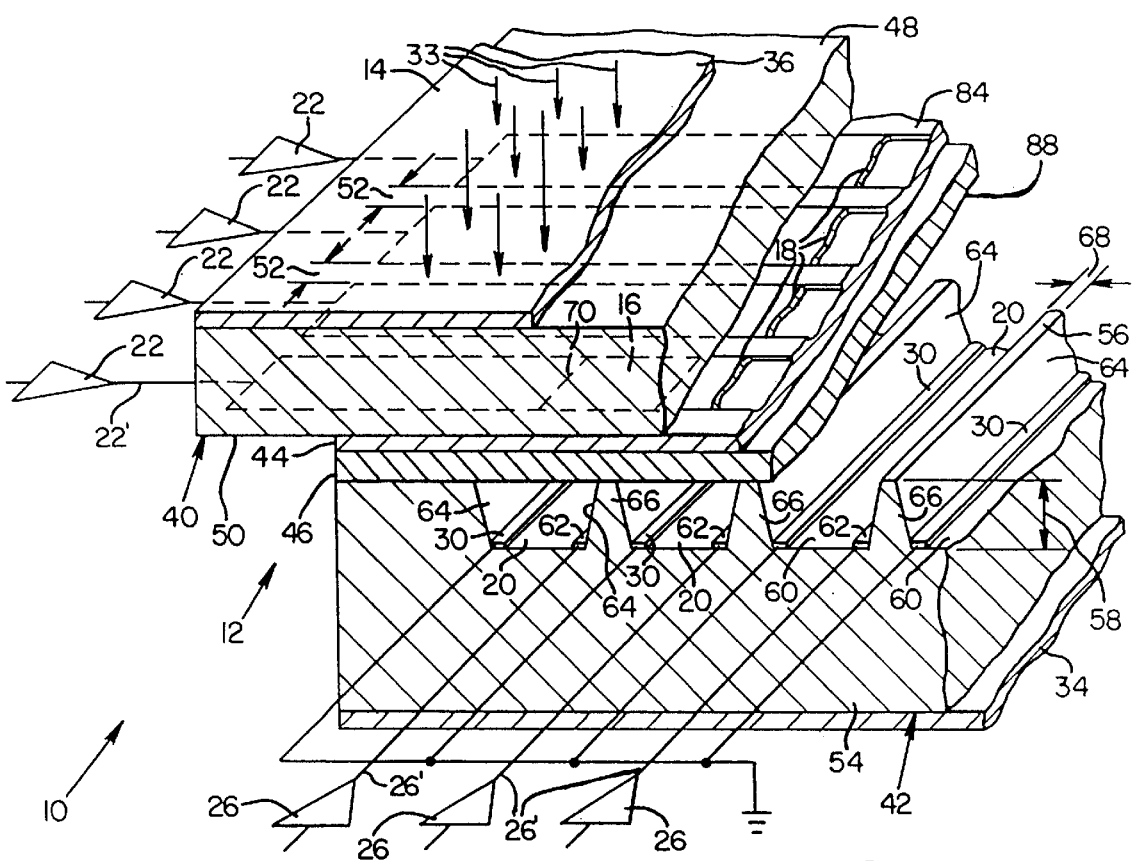
FIG. 2 is an enlarged fragmentary isometric view showing the layers of structural components forming the prior art display panel as viewed from the left side in FIG. 1.
Figure 3:
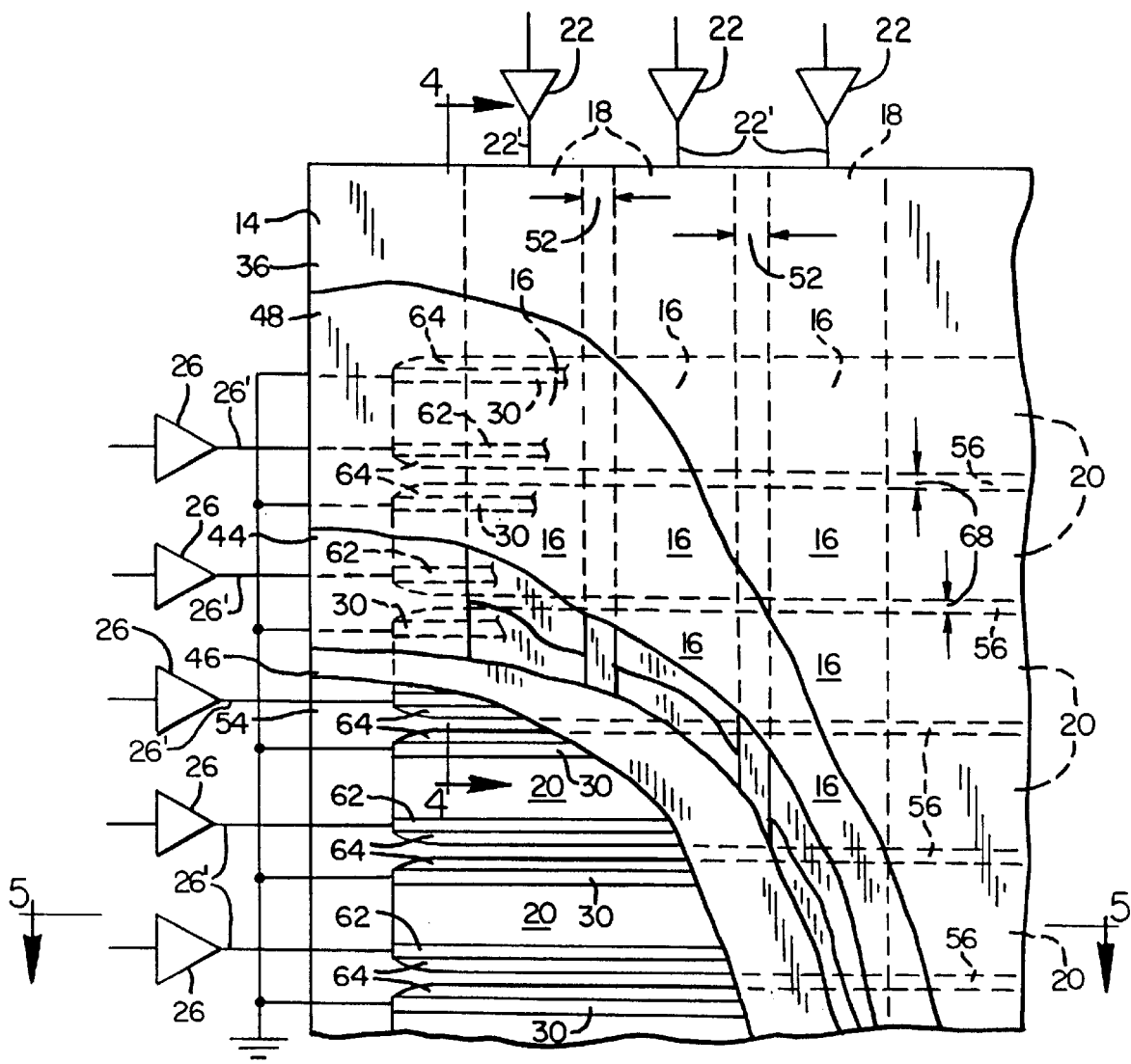
FIG. 3 is an enlarged fragmentary frontal view with portions broken away to show different depth-wise views of the interior of the prior art display panel of FIG. 2.

FIGS. 1–3 show a prior art flat panel display system 10, which comprises a display panel 12 having a display surface 14 that contains a pattern formed by a rectangular planar array of nominally identical data storage or display elements ("pixels") 16 mutually spaced apart by predetermined distances in the vertical and horizontal directions. Each pixel 16 in the array represents the overlapping intersection of a thin, narrow, vertically oriented electrode 18 and an elongated, narrow, horizontally oriented plasma channel 20. (Electrodes 18 are hereafter referred to as "column electrodes 18.") All of pixels 16 of a particular plasma channel 20 are set simultaneously when the inert gas in the plasma channel is sufficiently ionized. Each pixel is set to the potential gradient between the column electrode and ground at this time.

The widths of column electrodes 18 and plasma channels 20 determine the dimensions of pixels 16, which are of rectangular shape. Column electrodes 18 are deposited on a major surface of a first electrically nonconductive, optically transparent substrate, and plasma channels 20 are inscribed in a major surface of a second electrically nonconductive, optically transparent substrate. Skilled persons will appreciate that certain systems, such as a reflective display of either the direct view or projection type, would require that only one of the substrates be optically transparent.

Column electrodes 18 receive data drive signals of the analog voltage type developed on parallel output conductors 22' by different ones of the output amplifiers 22 (FIGS. 2 and 3) of a data driver or drive circuit 24, and plasma channels 20 receive data strobe signals of the voltage pulse type developed on output conductors 26' by different ones of output amplifiers 26 (FIGS. 2 and 3) from the output of data strobe 28. Each of the plasma channels 20 includes a reference or anode electrode 30 (FIGS. 2 and 3) to which a reference potential common to each plasma channel 20 and data strobe 28 is applied.

To synthesize an image on the entire area of display surface 14, display system 10 employs a scan control circuit 32 that coordinates the functions of data driver 24 and data strobe 28 so that all columns of pixels 16 of display panel 12 are addressed row by row in row scan fashion. Display panel 12 may employ electro-optic materials of different types. For example, if it uses such a material that changes the polarization state of incident light rays 33 (FIG. 2), display panel 12 is positioned between a pair of light polarizing filters 34 and 36 (FIG. 2), which cooperate with display panel 12 to change the luminance of light propagating through them. The use of a scattering liquid crystal cell as the electro-optic material would not require the use of light polarizing filters 34 and 36, however. A color filter (not shown) may be positioned within display panel 12 to develop multi-colored images of controllable color intensity. For a projection display, color can also be achieved by using three separate monochrome panels 10, each of which controls one primary color.

With particular reference to FIGS. 2 and 3, display panel 12 comprises an addressing structure that includes a pair of generally parallel electrode structures 40 and 42 spaced apart by a layer 44 of electro-optic material, such as a nematic liquid crystal, and a thin layer 46 of a dielectric material, such as glass, mica, or plastic. Electrode structure 40 comprises a glass dielectric substrate 48 that has deposited on its inner surface 50 column electrodes 18 of indium tin oxide, which is optically transparent, to form a striped pattern. Adjacent pairs of column electrodes 18 are spaced apart a distance 52, which defines the horizontal space between next adjacent pixels 16 in a row.

Electrode structure 42 comprises a glass dielectric substrate 54 into which top surface 56 multiple plasma channels 20 of trapezoidal cross section with rounded side walls are inscribed. Plasma channels 20 have a depth 58 measured from top surface 56 to a base portion 60. Each one of plasma channels 20 includes a cathode electrode 62 in addition to anode electrode 30, both of which are thin and narrow. Each of these electrodes extends along the length of base portion 60 and one of a pair of inner side walls 64 that diverge in the direction away from base portion 60 toward top surfaces 56.

The anode electrodes 30 of the plasma channels 20 are connected to a common electrical reference potential, which can be fixed at ground potential as shown. The cathode electrodes 62 of the plasma channels 20 are connected to different ones of the output amplifiers 26 (of which three and five are shown in FIG. 2 and FIG. 3, respectively) of data strobe 28. To ensure proper operation of the addressing structure, anode electrodes 30 and cathode electrodes 62 preferably are connected to the electrical reference potentials and the amplified outputs 26' of data strobe 28, respectively, on opposite edges of display panel 10.

The sidewalls 64 between adjacent plasma channels 20 define a plurality of support structures 66, top surfaces 56 of which support thin layer 46 of dielectric material. Adjacent plasma channels 20 are spaced apart by a width 68 of the top portion of each support structure 66, which width 68 defines the vertical space between next adjacent pixels 16 in a column. The overlapping regions 70 of column electrodes 18 and plasma channels 20 define the dimensions of pixels 16, which are shown in dashed lines in FIGS. 2 and 3. FIG. 3 shows with better clarity the array of pixels 16 and the vertical and horizontal spacings between them.

The magnitude of the voltage applied to column electrodes 18 specifies the distance 52 to promote isolation of adjacent column electrodes 18. Distance 52 is typically much less than the width of column electrodes 18. The inclinations of inner side walls 64 between adjacent plasma channels 20 specify the width 68, which is typically much less than the width of plasma channels 20. The widths of column electrodes 18 and plasma channels 20 are typically the same and are a function of the desired image resolution, which is specified by the display application. It is desirable to make distances 52 and width 68 as small as possible. In display panel 12, the channel depth 58 is approximately one-half the channel width.

Each of plasma channels 20 is filled with an ionizable gaseous mixture, generally a mixture of inert gasses. Thin layer 46 of dielectric material functions as an isolating barrier between the ionizable gaseous mixture contained within plasma channel 20 and layer 44 of liquid crystal material. The absence of dielectric thin layer 46 would, however, permit either the liquid crystal material to flow into plasma channel 20 or the ionizable gaseous mixture to contaminate the liquid crystal material. Thin layer 46 may be eliminated from displays that employ a solid or encapsulated electro-optic material.

Figure 4:
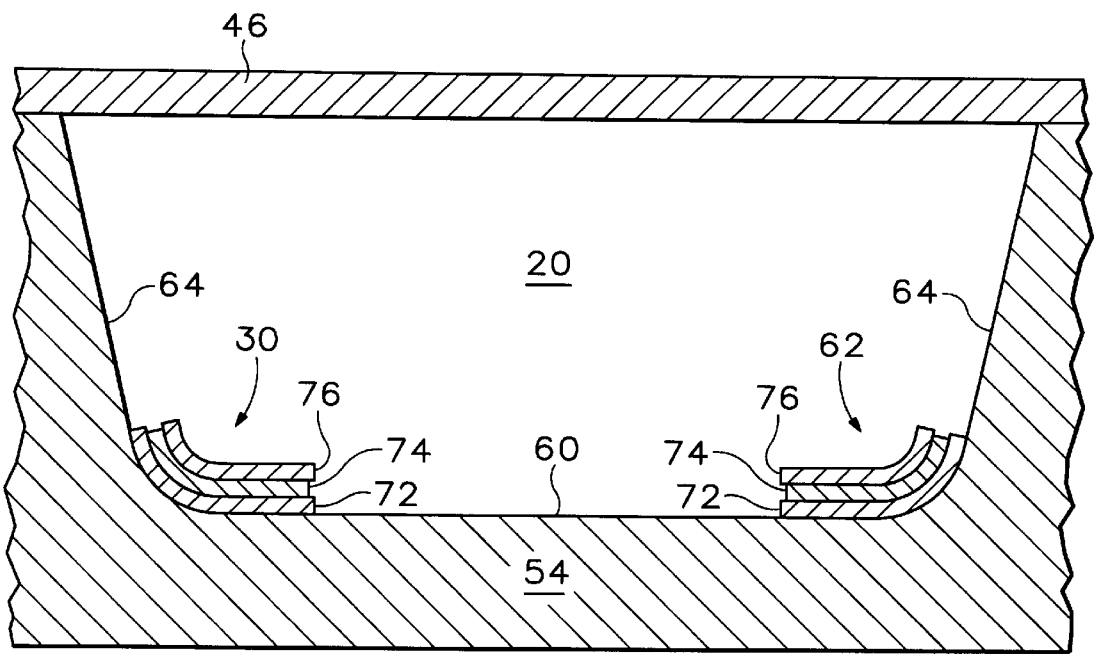
FIG. 4 is an enlarged cross-sectional view taken along lines 4—4 of FIG. 3 showing a prior art first embodiment of a channel and electrodes in a plasma addressing structure (shown enlarged relative to scale for clarity of presentation).

FIG. 4 shows in greater detail a first embodiment of prior art plasma channel 20 formed in glass substrate 54. Plasma channel 20 is 450 microns wide at the top where it is enclosed by thin layer 46, 200 microns deep between thin layer 46 and base portion 60, and 300 microns wide across base portion 60. Anode electrode 30 and cathode electrode 62 (hereafter "electrodes 30 and 62") each are 75 microns wide and have 0.2 micron thick bottom layers 72 of chromium for good adhesion to glass substrate 54, 2.0 micron thick copper layers 74 for good conductance and 0.2 micron thick top layers 76 of chromium for sealing copper layers 74 against oxidation. Skilled persons will appreciate that all dimensions are approximate, that copper is highly electrically conductive, and that chromium is electrically conductive and gas impermeable.

The first embodiment of prior art plasma channel 20 and electrodes 30 and 62 is typically formed by well-known glass etching and additive thin film deposition techniques, such as sputtering, evaporative coating, or cataphoretic deposition with or without a patterning mask.

Alternatively, subtractive processes may be employed, such as laying down a conductive layer, photo patterning a resist layer, and etching away all but the desired pattern of the conductive layer. This process may be repeated to produce a multilayer structure, such as the one shown in FIG. 4.

The above-described glass etching and thin film deposition processes represent only one set of manufacturing processes for making plasma addressing structures. Many other manufacturing processes may be employed, such as thick film, screen printing, and combinations of the above processes. However, some of these processes are not amenable to making addressing structures such as the one shown in FIG. 4.

Therefore, alternative embodiments of PALC display electrode structures that are amenable to being made with such processes are described in U.S. Pat. No. 5,453,660, issued Sep. 26, 1995, for BI-CHANNEL ELECTRODE CONFIGURATION FOR AN ADDRESSING STRUCTURE USING AN IONIZABLE GASEOUS MEDIUM AND METHOD OF OPERATING IT, which is assigned to the assignee of this application and incorporated herein by reference.

Figure 5:
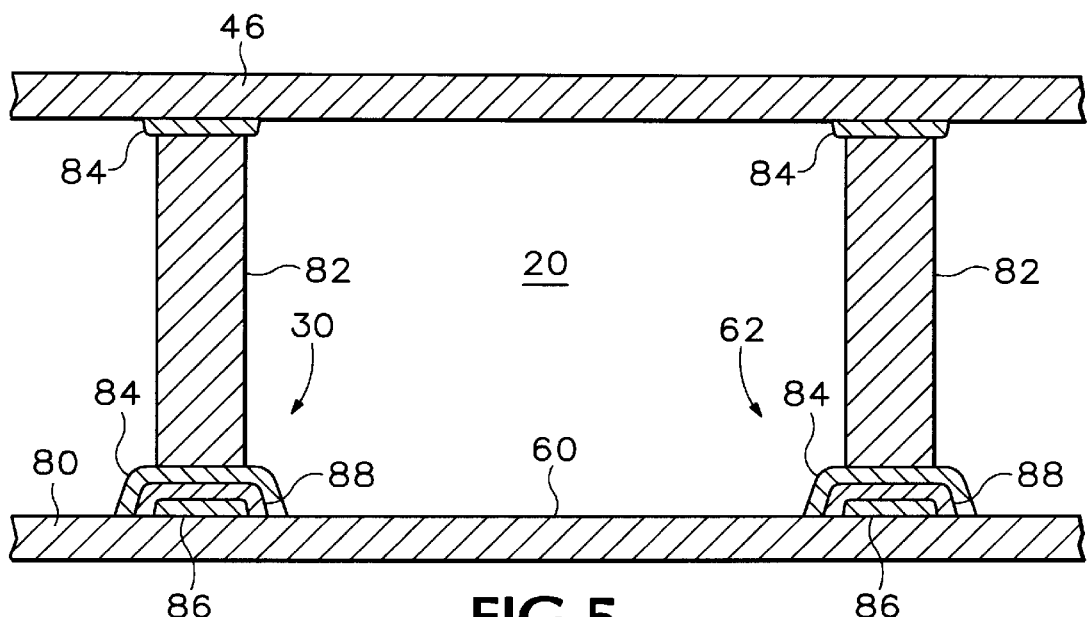
FIG. 5 is an enlarged sectional view showing a prior art second embodiment of a channel and electrodes in a plasma addressing structure (shown enlarged relative to scale for clarity of presentation).

FIG. 5 shows in greater detail a second embodiment of prior art plasma channel 20 enclosed between thin layer 46, a planar glass substrate 80, and a pair of ribs 82. In this embodiment, electrodes 30 and 62 are typically formed on base portion 60 of glass substrate 80 by employing additive processes, such as multilayer thick film screen printing and firing. Ribs 82 may also be formed additively on top of electrodes 30 and 62 by, for example, depositing a rib-forming layer, soft baking to solidify the layer, depositing another layer, soft baking, repeating the process until ribs 82 have an appropriate height, and firing the completed rib structure. Alternatively, ribs 82 may be formed from an insulating glass or fiber material and fused to thin layer 46 and electrodes 30 and 62 by conductive nickel frit 84.

In the second embodiment of prior art plasma channel 20, electrodes 30 and 62 are typically formed by screen printing metallic conductors 86 on base portion 60. Optional additional layers 88, such as distribution buses or emissive layers, may be deposited or screen printed on top of metallic conductors 86. U.S. Pat. No. 5,453,660 describes various other alternatives for forming electrodes 30 and 62 and plasma channel 20.

Figure 6:
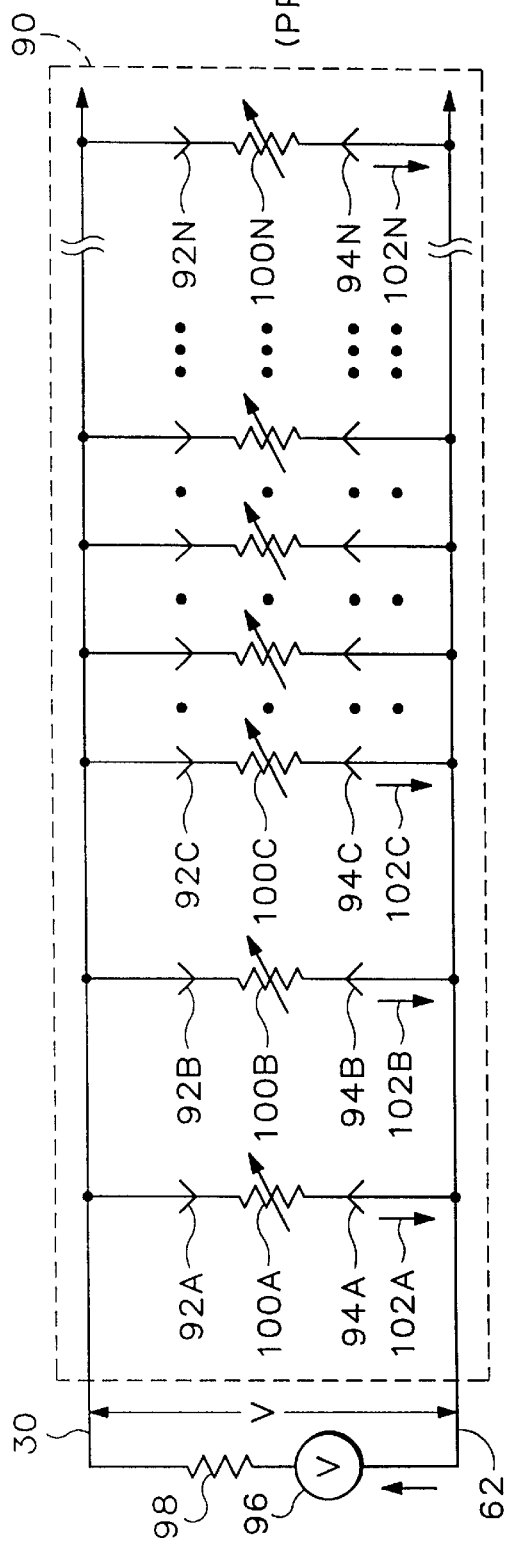
FIG. 6 is an electrical equivalent circuit diagram of the prior art plasma addressing structures of FIGS. 4 and 5.

FIG. 6 shows an electrical equivalent circuit diagram of the addressing structures of FIGS. 4 and 5. Electrodes 30 and 62 extend in a substantially parallel configuration through an ionizable gaseous medium 90 (represented as being enclosed by dashed lines). Electrode 30 includes multiple adjacent discharge points 92A, 92B, 92C, . . . , and 92N (collectively "discharge points 92"), and electrode 62 includes corresponding adjacent discharge points 94A, 94B, 94C, . . . , and 94N (collectively "discharge points 94"). The output amplifiers 26 (FIGS. 2 and 3) that drive electrodes 30 or 62 are represented by a voltage source 96 that impresses a voltage V across electrodes 30 and 62. Voltage source 96 has an internal impedance represented by resistor 98.

Voltage V must be sufficient to cause a discharge current to flow from discharge points 92, through ionizable gaseous medium 90 (hereafter "medium 90"), and into discharge points 94. The amount of discharge current depends on the magnitude of voltage V and the resistance of medium 90 between each pair of corresponding discharge points 92 and 94, which resistance is a variable depending on the localized spacing, shape, and configuration of electrodes 30 and 62 and the pressure, gas mixture, temperature, and ionization threshold voltage of medium 90. Moreover, the resistance of medium 90 is high when no discharge current is flowing (medium 90 is not ionized) and is relatively low when a discharge current is flowing (medium 90 is ionized). The resistance of medium 90 between each pair of discharge points 92 and 94 is represented by corresponding variable resistors 100A, 100B, 100C, . . . , and 100N. The discharge current flowing between each pair of discharge points 92 and 94 is represented by corresponding discharge currents 102A, 102B, 102C, . . . , and 102N.

Assume, for example, that voltage V is suddenly impressed across electrodes 30 and 62 by voltage source 96. Further assume that medium 90 ionizes first between discharge points 92B and 94B, causing variable resistor 100B to assume a low value relative to adjacent variable resistors 100A and 100C. Suddenly increased discharge current 102B flows through voltage source 96 and causes a voltage drop across resistor 98 that suddenly decreases voltage V impressed across electrodes 30 and 62. In a worst case example, voltage V drops below the ionization threshold voltage of medium 90 somewhere along the length of electrodes 30 and 62, preventing ionization of medium 90 in those areas. In another example, voltage V is reduced along the length of electrodes 30 and 62, causing decreased discharge current between adjacent discharge point pairs, such as 92A and 94A and 92C and 94C. In either example, excessive and nonuniform plasma discharge current occurs along the lengths of electrode 30 and 62, which leads to problems, such as electrode sputtering, nonuniform display addressing, or, in the worst case, display addressing dropouts.

Figure 7:
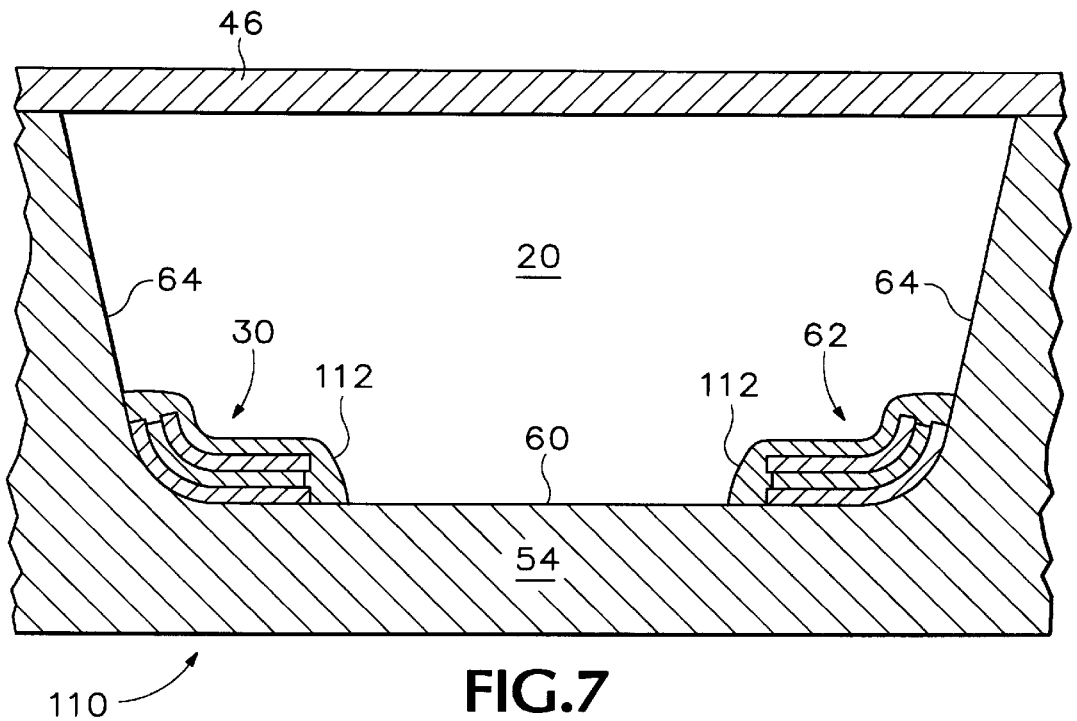
FIG. 7 is an enlarged sectional view showing a first embodiment of a channel and electrodes in an improved plasma addressing structure of this invention.

FIG. 7 shows a first embodiment of a channel and electrodes in an improved plasma addressing structure 110 of this invention. Improved plasma addressing structure 110 starts with a prior art plasma addressing structure, such as the one shown in FIG. 4, and adds a resistive layer 112 over the top of at least one of electrodes 30 and 62. Resistive layers 112 are shown over the top of both electrodes 30 and 62, but it should be understood that the invention will function suitably with resistive layer 112 applied to just one electrode, and the electrode starting structure is not limited to the one shown in FIG. 4. Resistive layer 112 limits and renders uniform the discharge current flowing in improved plasma addressing structure 110 as described with reference to FIG. 9.

A preferred way of making improved plasma addressing structure 110 entails forming resistive layer 112 over at least one of electrodes 30 and 62 by cataphoretically depositing through a mask a mixture comprising 75% ruthenium dioxide and 25% glass frit (Corning 8463 glass frit) to a thickness of 2 to 4 microns and firing the deposited mixture for one hour at 400 degrees centigrade.

Alternatively, a layer of ruthenium dioxide may first be deposited followed by a layer of glass frit. The deposited combination may then be fired for one hour at 400 degrees centigrade.

An optional emissive layer (not shown) comprising 75% lanthanum hexaboride ($LaB_6$) and 25% glass frit may be deposited on top of resistive layer 112 and fired for one hour at 400 degrees centigrade. As above, the $LaB_6$ and glass frit may be deposited separately and then fired.

Figure 8:
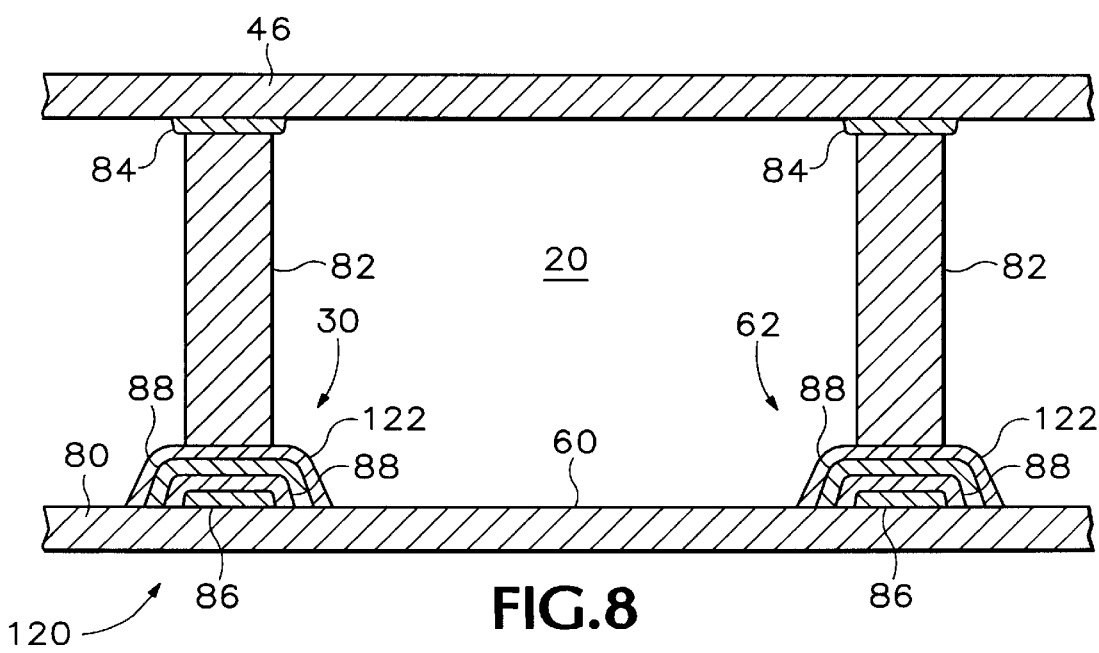
FIG. 8 is an enlarged sectional view showing a second embodiment of a channel and electrodes in an improved plasma addressing structure of this invention.

FIG. 8 shows a second embodiment of a channel and electrodes in an improved plasma addressing structure 120 of this invention. Improved plasma addressing structure 120 starts with a prior art plasma addressing structure such as the one shown in FIG. 5 and adds a resistive layer 122 over the top of at least one of electrodes 30 and 62. Resistive layers 122 are shown over the top of both electrodes 30 and 62, but it should be understood that the invention will function suitably with resistive layer 122 applied to just one electrode and the electrode starting structure is not limited to the one shown in FIG. 5. In like manner for resistive layer 112 of FIG. 7, resistive layer 122 limits and renders uniform the discharge current flowing in improved plasma addressing structure 120 as described with reference to FIG. 9.

A preferred way of making improved plasma addressing structure 120 entails forming resistive layer 122 over at least one of electrodes 30 and 62 by employing additive processes, such as multilayer thick film screen printing and firing. First, electrodes 30 and 62 are formed by screen printing metallic conductors 86 on base portion 60. Additional layers 88, such as distribution buses, may be deposited or screen printed on top of metallic conductors 86. Next, resistive layer 122 is screen printed on top of metallic conductors 86 and additional layers 88. Resistive layer 122 preferably is a mixture of 75% ruthenium dioxide and 25% glass frit. Alternatively, a layer of ruthenium dioxide may first be screen printed followed by a layer of glass frit. In either alternative, the screen printed combination is then fired for one hour at 400 degrees centigrade.

An optional emissive layer (not shown) comprising 75% $LaB_6$ and 25% glass frit may be screen printed on top of resistive layer 122 and fired for one hour at 400 degrees centigrade. As in the first embodiment, the $LaB_6$ and glass frit may be screen printed separately and then fired. Of course, the optional emissive layer may be cataphoretically deposited.

When employing screen printing, skilled workers will recognize that a 120 degree centigrade, 20 minute "soft bake" between screen printings will stabilize each layer prior to screen printing the next layer. As before, the final combination of layers are fired for one hour at 400 degrees centigrade to fuse the materials together and to bond resistive layer 122 to ribs 82.

Figure 9:
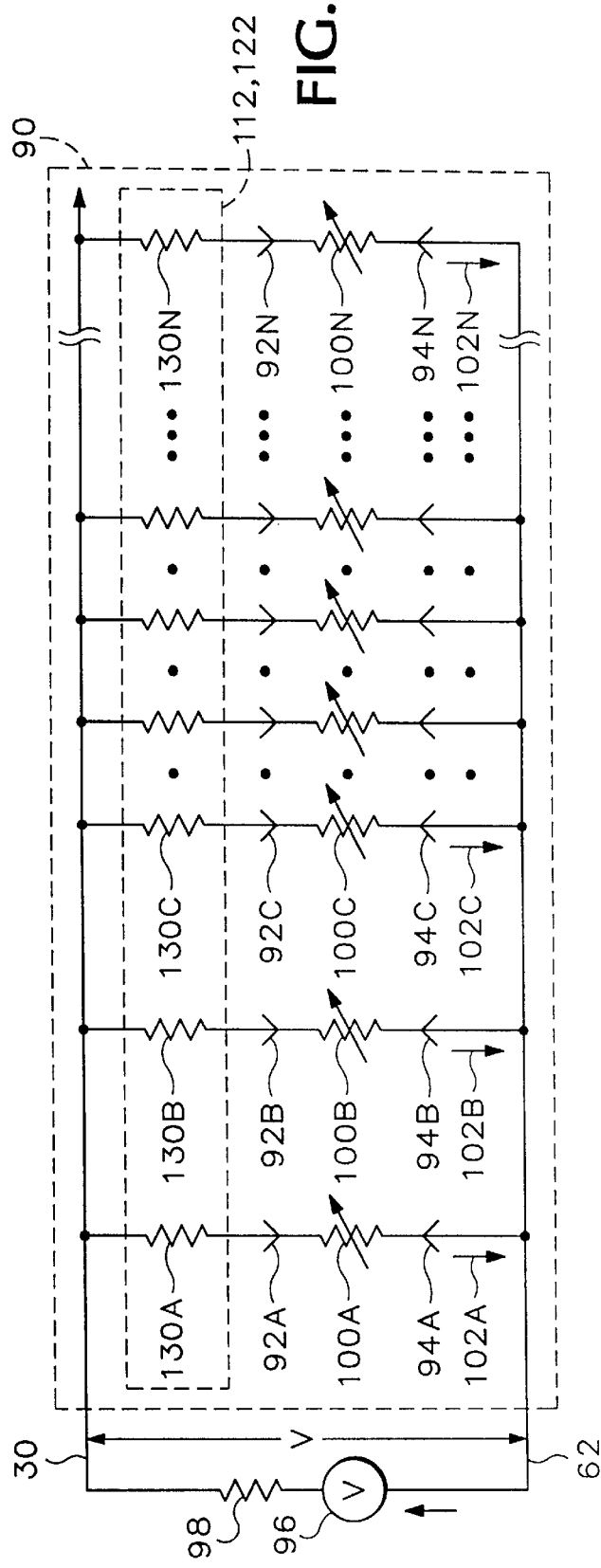
FIG. 9 is an electrical equivalent circuit diagram of the improved plasma addressing structures of FIGS. 7 and 9.

FIG. 9 shows an electrical equivalent circuit of an exemplary improved plasma addressing structure, such as the ones shown in FIGS. 7 and 8. In this example, however, resistive layer 112, 122 is shown applied only to electrode 30. Resistive layer 112, 122 acts as a resistor 130A, 130B, 130C, . . . , and 130N inserted in series with each corresponding pair of discharge points 92 and 94 and electrode 30. Series resistors 130 prevent each of discharge currents 102 from reaching excessive levels that can cause life-reducing effects, such as sputtering.

This discharge current limiting simultaneously has the beneficial property of equalizing discharge currents 102 along the entire length of electrodes 30 and 62: For a given voltage V, an amount of discharge current 102 will flow between each corresponding pair of discharge points 92 and 94 that depends on the total resistance in the discharge current path. In the prior art example described with reference to FIG. 6, only variable resistors 100 were in each path and were subject to wide resistance variations. If a variable resistor 100 was large or if voltage V was reduced to a small value by an excessive discharge current 102, it was explained that medium 90 may not ionize between certain pairs of discharge points 92 and 94.

However, as shown in FIG. 9, by inserting resistors 130 in series with discharge points 92 and 94, if a particular discharge current, say current 102B, is large by virtue of a relatively small value of variable resistor 100B, the resulting current 102B will be limited by resistor 130B. Moreover, the voltage drop across resistor 130B will be relatively large, thereby tending to isolate voltage V from the effects of discharge current 102B, or for that matter, from any other excessive discharge current 102.

Because discharge currents 102 are limited and voltage V is stabilized, discharge currents 102 are primarily determined by voltage V, resistors 130, and variable resistors 100. Therefore, variabilities in variable resistors 100 are reduced to a secondary effect, and each of discharge currents 102 are substantially equalized. This provides a uniformly distributed discharge current along the entire lengths of electrodes 30 and 64, which prevents display addressing dropouts.

Skilled workers will recognize that portions of this invention may be implemented differently from the implementations described above for preferred embodiments. For example, many partially conductive compounds or combinations of refractory compounds are useful for forming resistive layers 112 and 122 of this invention. Such alternative compounds may include indium tin oxide and frit or boron nitride and frit.

The invention is described herein in a general way so that it may be employed in other plasma addressed devices, such as a video camera, megasample analog memory, and a display that uses an electrooptic effect other than liquid crystal, as well as AC and DC plasma display devices.

It will be obvious to those having skill in the art that many changes may be made to the details of the above-described embodiments of this invention without departing from the underlying principles thereof. Accordingly, it will be appreciated that this invention is also applicable to electrode structures other than those found in PALC displays. The scope of this invention should, therefore, be determined only by the following claims.

We claim:

1. An addressing structure for addressing a data element, the addressing structure including an ionizable gaseous medium, a data element that stores a data signal, and at least first and second elongated electrodes having a length, wherein a sufficiently large potential difference between the first and second elongated electrodes causes a discharge current to flow in the ionizable gaseous medium and provide an interruptible electrical connection between the data element and at least one of the first and second elongated electrodes to selectively address the data element, and wherein the first elongated electrode is of substantially uniform structure over substantially its entire length and comprises:
    a layer of electrically conductive material extending along the length of the first elongated electrode; and
    a resistive layer extending along the length of the first elongated electrode to limit the discharge current and to uniformly distribute the discharge current flowing in the ionizable gaseous medium.

2. The addressing structure of claim 1 in which the resistive layer comprises cataphoretically deposited particles that are thermally fused together and to the first elongated electrode.

3. The addressing structure of claim 2 in which the particles comprise a mixture of at least one partially conductive compound and a frit material.

4. The addressing structure of claim 3 in which the frit material is glass frit.

5. The addressing structure of claim 3 in which the mixture comprises about 75% partially conductive compound and about 25% frit material.

6. The addressing structure of claim 3 in which the partially conductive compound includes at least one of ruthenium dioxide, indium tin oxide, and boron nitride.

7. The addressing structure of claim 1 further including an emissive layer formed over the resistive layer, the emissive layer including lanthanum hexaboride.

8. The addressing structure of claim 7 in which the emissive layer comprises a mixture of about 75% lanthanum hexaboride and about 25% glass frit.

9. A method of making an addressing structure including a substrate of electrically nonconductive material having a series of spaced-apart plasma channels in one of its major surfaces, an ionizable gaseous medium in the plasma channels, a data element that stores a data signal, and first and second elongated electrodes extending lengthwise along each of the plasma channels, wherein a potential difference between the first and second elongated electrodes causes a discharge current to flow in the ionizable gaseous medium and provide an interruptible electrical connection between the data element and at least one of the first and second elongated electrodes to selectively address the data element, the method including making the first and second elongated electrodes by:
    forming first and second stripes of electrically conductive material lengthwise along each one of the plasma channels;
    performing cataphoresis to deposit a resistive layer onto the first stripe of conductive material in each plasma channel; and
    fusing the resistive layer to the first stripe of conductive material by air baking the substrate, the first stripe, and the resistive layer.

10. The method of claim 9 in which the fusing step is carried out at about 400 degrees centigrade for about one hour.

11. The method of claim 9 in which particles of a frit are co-deposited in the resistive layer during the performing cataphoresis step.

12. The method of claim 11 in which the particles of the frit material are particles of a glass frit material.

13. The method of claim 9 in which the resistive layer comprises a mixture of at least one partially conductive compound and a frit material.

14. The method of claim 13 in which the mixture comprises about 75% partially conductive compound and about 25% frit material.

15. The method of claim 13 in which the partially conductive compound includes at least one of ruthenium dioxide, indium tin oxide, and boron nitride.

16. The method of claim 9 further including depositing an emissive layer over the resistive layer.

17. The method of claim 16 in which the emissive layer comprises a mixture of about 75% lanthanum hexaboride and about 25% glass frit.

18. A method of making an addressing structure including a substrate of electrically nonconductive material, first and second elongated electrodes along a major surface of the substrate, an ionizable gaseous medium, and a data element that stores a data signal, wherein a potential difference between the first and second elongated electrodes causes a discharge current to flow in the ionizable gaseous medium and provide an interruptible electrical connection between the data element and at least one of the first and second elongated electrodes to selectively address the data element, the method including making the first and second elongated electrodes by:
    forming at least first and second parallel stripes of electrically conductive material along said major surface of the substrate;
    printing a resistive layer onto the first stripe of conductive material; and
    fusing the resistive layer to the first stripe of conductive material by air baking the substrate, the first stripe, and the resistive layer,
    and wherein the first electrode is substantially uniform in structure over substantially its entire length.

19. The method of claim 18 in which the fusing step is carried out at about 400 degrees centigrade for about one hour.

20. The method of claim 18 in which particles of a frit are co-deposited in the resistive layer during the printing step.

21. The method of claim 20 in which the particles of the frit material are particles of a glass frit material.

22. The method of claim 18 in which the resistive layer comprises a mixture of at least one partially conductive compound and a frit material.

23. The method of claim 22 in which the mixture comprises about 75% partially conductive compound and about 25% frit material.

24. The method of claim 22 in which the partially conductive compound includes at least one of ruthenium dioxide, indium tin oxide, and boron nitride.

25. The method of claim 18 further including printing an emissive layer over the resistive layer.

26. The method of claim 25 in which the emissive layer comprises a mixture of about 75% lanthanum hexaboride and about 25% glass frit.

27. The method of claim 18 including printing a resistive layer onto the first and second stripes of conductive material and fusing the resistive layer to the first and second stripes of conductive material in each plasma channel by air baking the substrate, the first and second stripes, and the resistive layers.

28. The method of claim 27 wherein the first and second electrodes are substantially uniform in structure over substantially their entire respective lengths.

29. The addressing structure of claim 1 in which the second elongated electrode comprises:

a layer of electrically conductive material extending along the length of the second elongated electrode; and a resistive layer extending along the length of the second elongated electrode to limit the discharge current and to uniformly distribute the discharge current flowing in the ionizable gaseous medium.

30. The addressing structure of claim 29 in which the second elongated electrode is of substantially uniform structure over substantially its entire length.

31. The addressing structure of claim 1 in which the layer of electrically conductive material is formed by thin film deposition.

32. The method of claim 9 including performing cataphoresis to deposit a resistive layer onto the first and second stripes of conductive material in each plasma channel and fusing the resistive layer to the first and second stripes of conductive material in each plasma channel by air baking the substrate, the first and second stripes, and the resistive layers.

33. The method of claim 9 wherein the first electrode is substantially uniform in structure over substantially its entire length.

34. The method of claim 9 in which the step of forming the first and second parallel stripes of electrically conductive material is performed by a thin film deposition technique.

35. A PALC panel including a channel member formed with at least one plasma channel and first and second electrodes in the channel and extending lengthwise thereof, each electrode including a layer of conductive material, and wherein the first electrode is substantially uniform in structure along substantially its entire length and includes a layer of resistive material over the layer of conductive material, whereby when a plasma exists in the channel and supports flow of current between the first and second electrodes, the layer of resistive material is electrically in series with the plasma between the layer of conductive material of the first electrode and the layer of conductive material of the second electrode.

* * * * *